(12) United States Patent
Chiang et al.

(10) Patent No.: US 12,744,501 B2
(45) Date of Patent: Sep. 22, 2026

(54) CURRENT SENSE AMPLIFIER CIRCUIT AND TRIMMING METHOD OF OFFSET REFERRED TO INPUT VOLTAGE

(71) Applicant: Richtek Technology Corporation, Hsinchu (TW)

(72) Inventors: Chia-Tseng Chiang, New Taipei (TW); Hao-Yu Li, New Taipei (TW)

(73) Assignee: Richtek Technology Corporation, Hsinchu (TW)

( * ) Notice: Subject to any disclaimer, the term of this patent is extended or adjusted under 35 U.S.C. 154(b) by 531 days.

(21) Appl. No.: 18/365,200

(22) Filed: Aug. 3, 2023

(65) Prior Publication Data

US 2024/0063767 A1 Feb. 22, 2024

Related U.S. Application Data

(60) Provisional application No. 63/373,079, filed on Aug. 22, 2022.

(30) Foreign Application Priority Data

Dec. 22, 2022 (TW) ................................. 111149512

(51) Int. Cl.
*H03F 3/45* (2006.01)
*G01R 19/00* (2006.01)
*H03F 1/08* (2006.01)

(52) U.S. Cl.
CPC ..... *H03F 3/45977* (2013.01); *G01R 19/0092* (2013.01); *H03F 1/08* (2013.01);
(Continued)

(58) Field of Classification Search
CPC ............ H03F 3/45977; H03F 3/45273; H03F 3/45475; H03F 2200/462; H03F 2200/481;
(Continued)

(56) References Cited

U.S. PATENT DOCUMENTS 6,166,670 A * 12/2000 O'Shaughnessy ...... G05F 3/262 341/145
11,429,131 B2 * 8/2022 Nakatani .................. G05F 3/30
(Continued)

FOREIGN PATENT DOCUMENTS

DE 102005007632 A1 * 8/2006 .............. H03F 3/24

OTHER PUBLICATIONS

3PEAK TP181, Zero-Drift, Bi-directional Current Sense Amplifier.
(Continued)

*Primary Examiner* — Andrea Lindgren Baltzell
*Assistant Examiner* — Lance Torbjorn Bartol
(74) *Attorney, Agent, or Firm* — Huan-Yi Lin

(57) ABSTRACT

A current sensing amplifier circuit includes: an amplifier configured to generate an output voltage correlated with a current to-be-sensed according to a first input voltage at a first input end and a second input voltage at a second input end in a normal operation mode; and a current source circuit configured to generate a trimming current according to the first input voltage and a reference voltage in a trimming mode and to provide the trimming current to trim an offset referred to input (RTI) voltage generated by the current sensing amplifier circuit in the normal operation mode. The current source circuit is coupled between: a first resistor and a non-inverting input end, a second resistor and the output voltage, a third resistor and the non-inverting input end, or a fourth resistor and an inverting input end.

19 Claims, 12 Drawing Sheets

(52) U.S. Cl.
CPC ..... *H03F 3/45273* (2013.01); *H03F 3/45475* (2013.01); *H03F 2200/261* (2013.01); *H03F 2200/375* (2013.01); *H03F 2200/462* (2013.01); *H03F 2200/481* (2013.01); *H03F 2203/45588* (2013.01)

(58) Field of Classification Search
CPC ..... H03F 2203/45588; H03F 2200/375; H03F 2200/261; H03F 1/08; G01R 19/0092
USPC .......................................................... 330/69
See application file for complete search history.

(56) References Cited

U.S. PATENT DOCUMENTS

2015/0015333 A1* 1/2015 Jasa .................. G01R 19/0023
330/261
2022/0057469 A1* 2/2022 Fortuny ................ G01R 1/203

OTHER PUBLICATIONS

On Semiconductor NCS199A1R, Current-Shunt Monitors, Voltage Output, Bidirectional, Zero-Drift, Low- or High-Side Current Sensing.
R. C. Yen and p. R. Gray, "A MOS switched-capacitor instrumentation amplifier," IEEE J. Solid-State Circuits, vol. SC-17, pp. 1008-1013, Dec. 1982.
Razvan Puscasu, Pavel Brinzoi, &Laurentiu Creosteanu,A High Voltage Current Sense Amplifier With Extended Input Common Mode Range Based On A Low Voltage Operational Amplifier Cell.
SGMICRO SGM8199 Voltage Output, High- or Low-Side Measurement, Bi-Directional Current Shunt Monitor.
TI INA213 Voltage Output, Low- or High-Side Measurement, Bidirectional, Zero-Drift Series, Current-Shunt Monitors.

* cited by examiner

306

Coupling a chopper circuit between the inverting input end and the non-inverting input end, wherein the chopper circuit is configured to operably suppress a variation of the offset RTI voltage caused by different input common mode voltages

CURRENT SENSE AMPLIFIER CIRCUIT AND TRIMMING METHOD OF OFFSET REFERRED TO INPUT VOLTAGE

CROSS REFERENCE

The present invention claims priority to U.S. 63/373,079 filed on Aug. 22, 2022 and claims priority to TW 111149512 filed on Dec. 22, 2022.

BACKGROUND OF THE INVENTION

Field of Invention

The present invention relates to a current sensing amplifier circuit and a trimming method of an offset referred to input (RTI) voltage thereof; particularly, it relates to such current sensing amplifier circuit capable of trimming the offset RTI voltage by providing a trimming current and a trimming method thereof.

Description of Related Art

Please refer to FIG. 1A and FIG. 1B. FIG. 1A shows a flow chart diagram of operation steps of a conventional trimming method 10 for trimming an offset referred to input (RTI) voltage in a conventional current sensing amplifier circuit. FIG. 1B shows a schematic diagram of a conventional current sensing amplifier circuit 11 having an offset RTI voltage trimming function. In the conventional current sensing amplifier circuit 11, because there are deviations during manufacturing the resistors R11, R21 and R31, an offset RTI voltage is undesirably generated to cause the gain of the conventional current sensing amplifier circuit 11 to become incorrect and not matching with the actual design, resulting in incorrect current sensing results. Please refer to FIG. 1A along with FIG. 1B. The conventional current sensing amplifier circuit 11 has two input ends Ni1 and Ni2, and another end receiving a reference voltage Vref, so that the conventional current sensing amplifier circuit 11 can sense a current in either direction. The conventional current sensing amplifier circuit 11 trims the offset RTI voltage by adjusting a resistance of a built-in programmable feedback resistor chain Rcr. As shown in FIG. 1B, in the trimming process, the conventional current sensing amplifier circuit 11 selects one or more resistors R41, R42, . . . in the built-in programmable feedback resistor chain Rcr to be connected in series to the output end, so as to trim the offset RTI voltage.

As compared to other prior art current sensing amplifier circuits (not shown), the prior art current sensing amplifier circuit 11 further includes a resistor R31 coupled to the reference voltage Vref, wherein the resistor R31 has one end coupled to the reference voltage Vref and has another end coupled to a non-inverting input end of an amplifier. There are two reasons for the conventional current sensing amplifier circuit 11 to couple the resistor R31 to the reference voltage Vref.

Firstly, if the reference voltage Vref applies a bias voltage on the non-inverting input end of the amplifier without the resistor R31, when the common mode voltage of the non-inverting input end and the inverting input end of the amplifier is electrically connected to a relatively higher voltage, for example when the prior art current sensing amplifier circuit 11 is applied in an upper gate circuit in a power conversion circuit, in the prior art current sensing amplifier circuit 11 without the resistor R31, the non-inverting input end and an inverting input end of the amplifier will directly receive a relatively higher voltage, which may damage the amplifier, or the amplifier may need to use higher cost devices which are able to withstand high voltage. In contrast, by adopting the resistor R31 coupled to the reference voltage Vref, the common mode voltage of the non-inverting input end and the inverting input end of the amplifier is reduced; as a result, the amplifier can use lower cost devices having lower voltage withstanding specification, and avoid damaging the amplifier.

Secondly, in normal operation mode, the relationship between input voltages (Vin+ and Vin−) and the output voltage Vout of the conventional current sensing amplifier circuit 11 can be represented by following equation:

$$Vout = Vref + (Vin+ - Vin-)[[^{*}]]\underline{\times} k$$

wherein k is a preset constant.

In a case when the input voltages Vin+ at the input end Ni1 is smaller than the input voltages Vin− at the input end Ni2, if the reference voltage Vref does not apply a bias voltage on the non-inverting input end of the amplifier (i.e., the reference voltage Vref is zero), the output voltage Vout will be a negative value according to the above-mentioned equation. However, if the amplifier power comes from a voltage drop generated by an internal power supply versus ground potential, the amplifier cannot generate a negative output voltage Vout. As a result, zero voltage will be the output in this case. However, if the reference voltage Vref applies a bias voltage at the non-inverting input end of the amplifier, the level of the output voltage Vout can be shifted to a positive value, in the case when the input voltages Vin+ at the input end Ni1 is smaller than the input voltages Vin− at the input end Ni2.

To be more specific, please refer to FIG. 1A. The conventional RTI voltage trimming method 10 in the conventional current sensing amplifier circuit 11 comprises the following steps: first in step 101, short circuiting a programmable feedback resistor chain Rcr (including resistors R4*a*, R41, R42, . . . which are connected in series among one another). In the step 101, the action "short circuiting a programmable feedback resistor chain Rcr" is achieved by turning ON a switch SW4*a* to short circuit the output voltage Vout and the non-inverting input end of the amplifier. Next, step 102 is executed: applying two different common mode voltages at the input ends (i.e., the input end Ni1 and the input end Ni2) and measuring two different output voltages Vout of the amplifier resulting from the two different common mode voltages, and calculating a difference between the two different output voltages Vout, to obtain a first output voltage difference. Next, step 103 is executed: removing the short circuit (i.e., turning OFF the switch SW4*a*) and measuring a non-trimmed resistance of the feedback resistor chain in the programmable feedback resistor chain Rcr. Next, step 104 is executed: with the non-trimmed resistance of the programmable feedback resistor chain Rcr, applying the aforementioned two different common mode voltages at the input ends (i.e., the input end Ni1 and the input end Ni2) and once again measuring two different output voltages Vout of the amplifier under the two different common mode voltages, and once again calculating a difference between the two different output voltages Vout to obtain a second output voltage difference. Next, step 105 is executed: deriving a linear equation based upon the aforementioned first output voltage difference, the aforementioned second output voltage difference and the aforementioned non-trimmed resistance of the feedback resistor chain (0 and Rcr). Next, step 106 is executed: obtaining a target feedback resistance according to the linear equation. Next, step 107 is executed: trimming the programmable feedback resistor chain Rcr to a resistor combination which most approximates to the target feedback resistance, and using the resistor combination as the feedback resistor chain. Next, step 108 is executed: in normal operation, sensing currents flowing through the two input ends of the amplifier according to the trimmed resistance of in the programmable feedback resistor chain Rcr.

The aforementioned conventional RTI voltage trimming method 10 has too many operation steps to be executed; furthermore, if there are two loops, all the operation steps need to be repeated, which is very laborious.

Although the conventional current sensing amplifier circuit 11 shown in FIG. 1B can sense currents in either way (i.e., the conventional current sensing amplifier circuit 11 can sense current both when the input voltage Vin+ is smaller than the input voltage Vin− and when the input voltage Vin− is smaller than the input voltage Vin+), its equivalent offset RTI voltage will vary as the input voltages Vin+ and Vin− and/or the reference voltage Vref vary. Under such circumstance, when the conventional current sensing amplifier circuit 11 trims the offset RTI voltage under a specific condition (e.g., under the condition of a specific input voltages and a specific reference voltage) to obtain a fixed trimmed value, and adjusts the resistance of the programmable feedback resistor chain Rcr accordingly, the corresponding offset RTI voltage under such specific condition can be compensated, so that there is no output offset (offset referred to output voltage) between the actual output voltage and the expected output voltage (i.e., the offset RTI voltage is zero). However, when the input voltages and/or the reference voltage vary (e.g., a different combination of the input voltages and the reference voltage other than the specific input voltages and the specific reference voltage), the offset RTI voltage will vary accordingly. In this case, the offset referred to output voltage under such different combination of the input voltages and the reference voltage cannot be ignored (i.e., the offset RTI voltage is not zero), resulting in errors in the current sensing results. Note that "offset referred to output voltage" is equal to the product of "offset RTI voltage" multiplied by a gain of the amplifier.

Note that other prior art current sensing amplifier circuits which trim the offset by a fixed trimming current have the same issue. Both "offset referred to output voltage" and "offset RTI voltage" are correlated with the input voltages Vin+ and Vin− and/or the reference voltage Vref. Therefore, when the input voltages Vin+ and Vin− vary (i.e., the input common mode voltage of the input voltages Vin+ and Vin− varies) and/or when the reference voltage Vref varies, the offset referred to output voltage and offset RTI voltage will correspondingly vary, resulting in errors of the current sensing results. As a result, if any prior art current sensing amplifier circuit trims the offset RTI voltage by a fixed trimming current (rather than a trimming current which is proportional to the input voltages Vin+ and Vin− and the reference voltage Vref), the trimmed result can only be applicable to one condition (corresponding to a certain combination of the specific input voltages and the specific reference voltage).

A prior art relevant to the present invention is "The Art of Electronics. Cambridge, U.K.", by P. Horowitz and W. Hill, published on Cambridge Univ. Press, 1989. This prior art discloses a conventional current sensor, which adopts three groups of operational amplifiers to generate the result in combination. The benefit of adopting such configuration is high common-mode rejection ratio (CMRR) and this prior art provides a common-used instrument amplifier circuit having a balanced high impedance. There are two parts in this conventional current sensor, which are an input stage and an output stage. The input stage serves as a buffer, whereas, the output stage serves as a differential amplifier, which provides a high differential gain. The differential gain can be adjusted by adjusting a resistance of one single resistor. Different from other resistors in the circuit, the resistance of this single resistor is not required to match with the resistances of other resistors. However, the configuration of this prior art is not applicable to compensating a systematic offset under high input common mode voltage.

Another prior art relevant to the present invention is "A High Voltage Current Sense Amplifier With Extended Input Common Mode Range Based On A Low Voltage Operational Amplifier Cell", by Razvan Puscasu, Pavel Brinzoi and Laurentiu Creosteanu. This prior art aims at providing a current sensor which is functional in a wide range of the input common mode voltage and can sense input current bidirectionally, wherein the input common mode voltage is irrelevant to power supply. However, the offset RTI voltage generated due to deviations in manufacturing the resistors results in that the gain of the circuit does not match with the design value, and further resulting in current sensing errors.

Yet another prior art relevant to the present invention is "A MOS switched-capacitor instrumentation amplifier", by R. C. Yen and P. R. Gray, published on IEEE J. Solid-State Circuits, vol. SC-17, pp. 1008-1013, December 1982, which discloses a current sensor. The configuration of this current sensor can broaden the range of the input common mode voltage, but this also leads to different offset RTI voltages under different input common mode voltages. By taking the manufacture deviations into consideration, which leads to inaccuracy of the output voltage, this prior art current sensor adopts a chopper circuit to suppress the offset RTI voltage deviation.

The following prior arts are relevant to the present invention: "TI: INA213 Voltage Output, Low- or High-Side Measurement, Bidirectional, Zero-Drift Series, Current-Shunt Monitor"; "On Semiconductor: NCS199A1R, Current-Shunt Monitors, Voltage Output, Bidirectional, Zero-Drift, Low- or High-Side Current Sensing"; "SGMICRO: SGM8199 Voltage Output, High- or Low-Side Measurement, Bi-Directional Current Shunt Monitor" and "3PEAK: TP181, Zero-Drift, Bi-directional Current Sense Amplifier".

SUMMARY OF THE INVENTION

From one perspective, the present invention provides a current sensing amplifier circuit, which is configured to operably sense a current to be sensed ("to-be-sensed current") flowing through a sensing resistor, wherein the sensing resistor has two ends correspondingly coupled to a first input end and a second input end of the current sensing amplifier circuit; the current sensing amplifier circuit comprising: an amplifier, which is configured to operably generate an output voltage correlated with the to-be-sensed current according to a first input voltage at the first input end and a second input voltage at the second input end in a normal operation mode; a first resistor coupled between a reference voltage and a non-inverting input end of the amplifier, wherein a resistance of the first resistor is a sum of a first resistance plus a first error resistance; a second resistor coupled between the output voltage and an inverting input end of the amplifier, wherein a resistance of the second resistor is a difference of the first resistance minus the first error resistance; a third resistor coupled between the first input end and the non-inverting input end of the amplifier, wherein a resistance of the third resistor is a difference of a second resistance minus a second error resistance; a fourth resistor coupled between the second input end and the inverting input end of the amplifier, wherein a resistance of the fourth resistor is a sum of the second resistance plus the second error resistance; and a current source circuit, which is configured to operably generate a trimming current in a trimming mode according to the first input voltage and the reference voltage, according to the second input voltage and the reference voltage, or according to an input common mode voltage and the reference voltage, and the current source circuit is configured to operably provide the trimming current to trim an offset referred to input (RTI) voltage generated due to the first error resistance and the second error resistance in the normal operation mode; wherein the current source circuit is coupled to: a first node between the first resistor and the non-inverting input end, a second node between the second resistor and the output voltage, a third node between the third resistor and the non-inverting input end, or a fourth node between the fourth resistor and the inverting input end; wherein in the trimming mode, the first input end is electrically connected to the second input end, so that the first input voltage has a same voltage level as the second input voltage.

In one embodiment, the current source circuit includes: a first voltage-to-current conversion circuit, which is configured to operably convert the first input voltage, the second input voltage or the input common mode voltage to generate a first current; a second voltage-to-current conversion circuit, which is configured to operably convert the reference voltage to generate a second current; and a trimming current generation circuit, which is configured to operably generate the trimming current according to the first current and the second current in the trimming mode, so that the output voltage is equal to or most approximates to the reference voltage.

In one embodiment, the trimming current generation circuit includes: a first current duplication circuit, which is configured to operably duplicate the first current, to generate a first duplication current; a second current duplication circuit, which is configured to operably duplicate the second current, to generate a second duplication current; a first summation circuit, which is configured to operably subtract the first duplication current by the second duplication current, to generate a first subtraction result; a second summation circuit, which is configured to operably subtract the second duplication current by the first duplication current, to generate a second subtraction result; a determination circuit, which is configured to operably generate a first enable signal when the first duplication current is higher than the second duplication current and generate a second enable signal when the second duplication current is higher than the first duplication current; a first current trimming circuit, which is configured to, when enabled by the first enable signal, trim the first subtraction result to generate a first trimming current; a second current trimming circuit, which is configured to, when enabled by the first enable signal, trim the second subtraction result to generate a second trimming current; and a third summation circuit, which is configured to operably execute a summation operation to add the first trimming current with the second trimming current, so as to generate the trimming current.

In one embodiment, each of the first current duplication circuit and the second current duplication circuit includes at least one current mirror circuit.

In one embodiment, the reference voltage is configured to operably adjust the input common mode voltage, so that the current sensing amplifier circuit has a bidirectional current sensing function.

In one embodiment, the current sensing amplifier circuit further comprises: a chopper circuit coupled between the inverting input end and the non-inverting input end, wherein the chopper circuit is configured to operably suppress a variation of the offset RTI voltage caused by different input common mode voltages.

In one embodiment, the offset RTI voltage is correlated with a compensation item of the trimming current, and wherein the compensation item is irrelevant to a gain error of the amplifier.

In one embodiment, the trimming current is proportional to a difference between the first input voltage and the reference voltage, a difference between the second input voltage and the reference voltage, or a difference between the input common mode voltage and the reference voltage.

In one embodiment, the first error resistance is smaller than ½ of the first resistance and the second error resistance is smaller than ½ of the second resistance.

In one embodiment, the current source circuit is configured to operably generate the trimming current in the trimming mode according to the first input voltage and the reference voltage by a binary approximation approach, a single-slope approximation approach or a successive approximation approach.

From another perspective, the present invention provides an offset referred to input (RTI) voltage trimming method, which is configured to operably trim an offset RTI voltage of a current sensing amplifier circuit; the offset RTI voltage trimming method comprising steps of: electrically connecting a first input end of the current sensing amplifier circuit to a second input end of the current sensing amplifier circuit, so that a first input voltage at the first input end has a same voltage level as a second input voltage at the second input end; converting the first input voltage, the second input voltage or an input common mode voltage to generate a first current; converting a reference voltage to generate a second current; and generating a trimming current according to the first current and the second current in a trimming mode, so that an output voltage is equal to or most approximates to the reference voltage; wherein a first resistor of the current sensing amplifier circuit is coupled between a reference voltage and a non-inverting input end of an amplifier of the current sensing amplifier circuit; and wherein in a normal operation mode, the trimming current is provided to trim the offset RTI voltage generated by the current sensing amplifier circuit.

In one embodiment, the step for generating the trimming current according to the first current and the second current in the trimming mode, so that the output voltage is equal to or most approximates to the reference voltage includes following steps: duplicating the first current, to generate a first duplication current; duplicating the second current, to generate a second duplication current; subtracting the first duplication current by the second duplication current, to generate a first subtraction result; subtracting the second duplication current by the first duplication current, to generate a second subtraction result; generating a first enable signal when the first duplication current is higher than the second duplication current and generating a second enable signal when the second duplication current is higher than the first duplication current; trimming the first subtraction result according to the first enable signal, to generate a first trimming current; trimming the second subtraction result according to the second enable signal, to generate a second trimming current; and executing a summation operation to add the first trimming current with the second trimming current, to generate the trimming current.

In one embodiment, the offset RTI voltage trimming method further comprises: coupling a chopper circuit between the inverting input end and the non-inverting input end, wherein the chopper circuit is configured to operably suppress a variation of the offset RTI voltage caused by different input common mode voltages.

In one embodiment, a resistance of the first resistor is a sum of a first resistance plus a first error resistance; wherein a second resistor of the current sensing amplifier circuit is coupled between the output voltage and an inverting input end of the amplifier, wherein a resistance of the second resistor is a difference of the first resistance minus the first error resistance; wherein a third resistor of the current sensing amplifier circuit is coupled between the first input end and the non-inverting input end of the amplifier, wherein a resistance of the third resistor is a difference of a second resistance minus a second error resistance; wherein a fourth resistor of the current sensing amplifier circuit is coupled between the second input end and the inverting input end of the amplifier, wherein a resistance of the fourth resistor is a sum of the second resistance plus the second error resistance; wherein the offset RTI voltage is correlated with the first error resistance and the second error resistance.

The present invention proposes a current sensing amplifier circuit and an offset RTI voltage trimming method having very simple trimming steps while achieving high accuracy thereof.

Advantages of the present invention include: that the current sensing amplifier circuit of the present invention can achieve bidirectional current sensing function; and that the present invention can cope with the manufacture deviations in resistors and improve the accuracy of the gain by a trimming current.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1A:
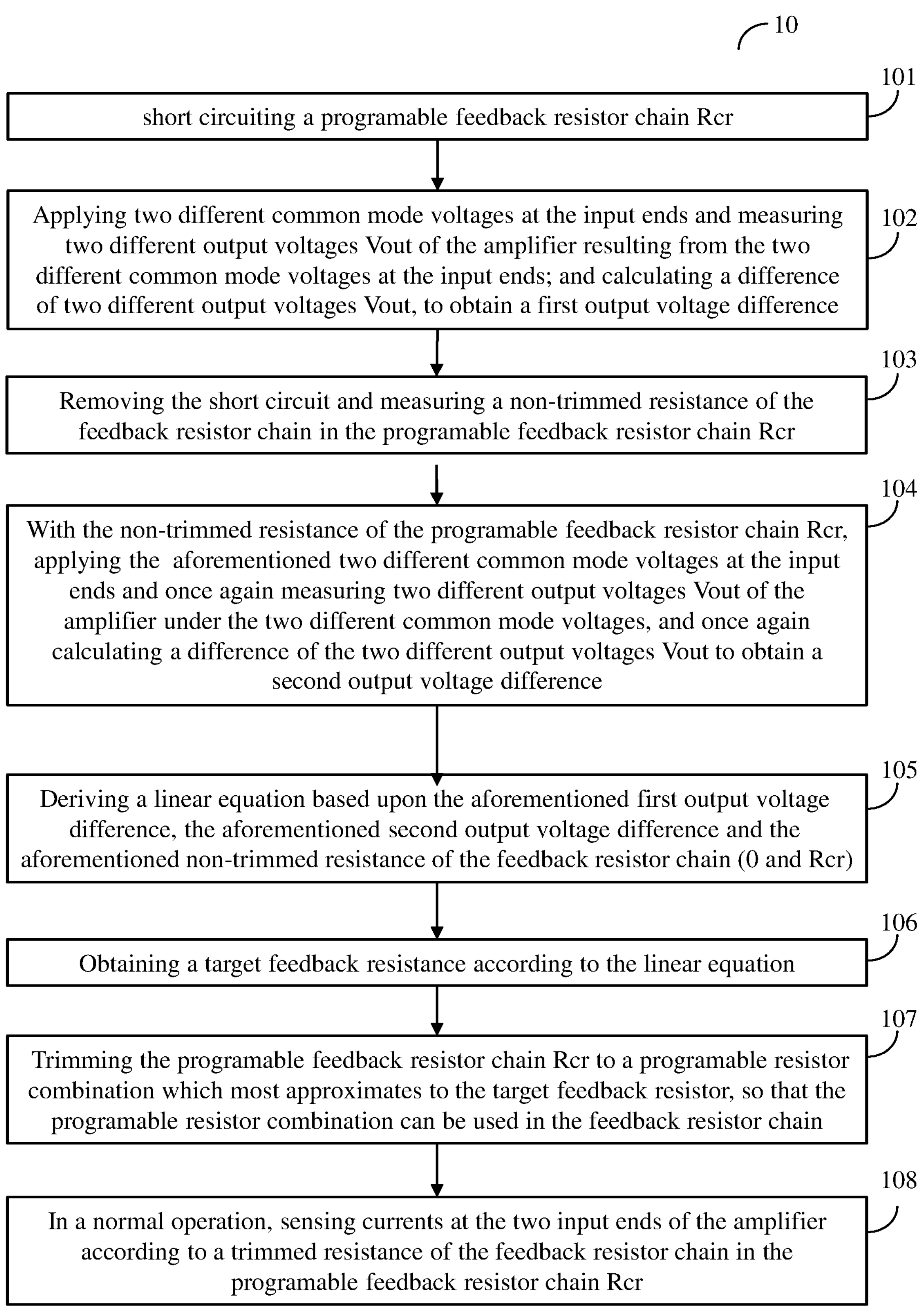
FIG. 1A shows a flow chart diagram of operation steps of a conventional trimming method for trimming an offset referred to input (RTI) voltage in a conventional current sensing amplifier circuit.
Figure 1B:
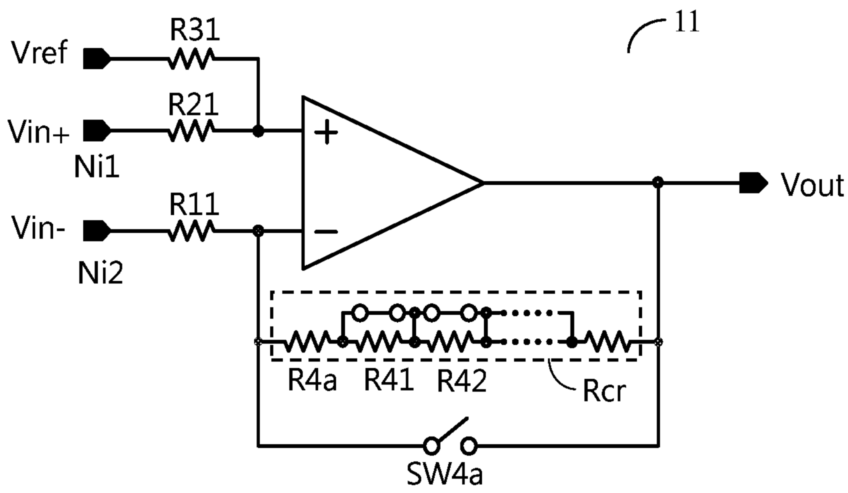
FIG. 1B shows a schematic diagram of a conventional current sensing amplifier circuit having an offset RTI voltage trimming function.
Figure 2A:
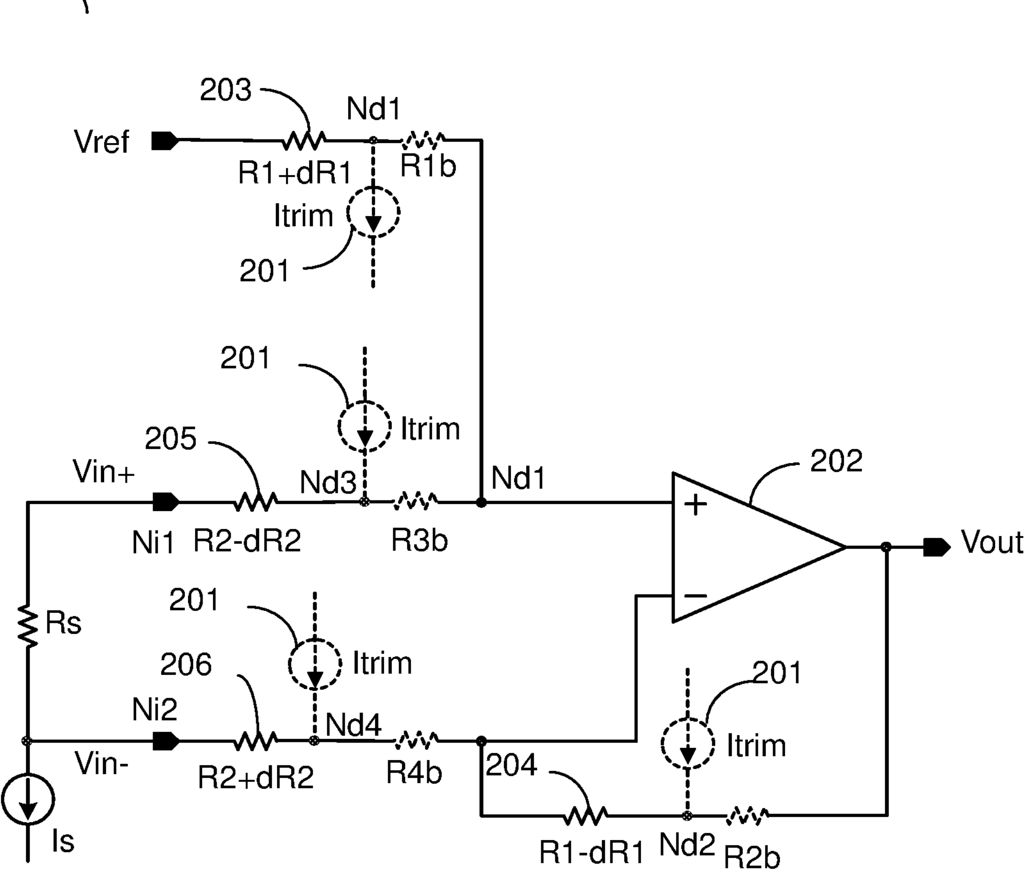
FIG. 2A shows a schematic circuit diagram of a current sensing amplifier circuit according to an embodiment of the present invention.

FIG. 2A shows a schematic circuit diagram of a current sensing amplifier circuit according to an embodiment of the present invention. As shown in FIG. 2A, the current sensing amplifier circuit 20 of the present invention is configured to operably sense a current Is ("to-be-sensed current") flowing through a sensing resistor Rs. The sensing resistor Rs has two ends correspondingly coupled to a first input end Ni1 and a second input end Ni2 of the current sensing amplifier circuit 20. The current sensing amplifier circuit 20 includes: a current source circuit 201, an amplifier 202, a first resistor 203, a second resistor 204, a third resistor 205 and a fourth resistor 206. The amplifier 202 is configured to operably generate an output voltage Vout correlated with the to-be-sensed current Is according to a first input voltage Vin+ at the first input end Ni1 and a second input voltage Vin− at the second input end Ni2 in a normal operation mode.

The first resistor 203 is coupled between a reference voltage Vref and a non-inverting input end of the amplifier 202, wherein the resistance of the first resistor 203 is a sum of a first resistance R1 plus a first error resistance dR1. The second resistor 204 is coupled between the output voltage Vout and an inverting input end of the amplifier 202, wherein the resistance of the second resistor is a difference between the first resistance R1 minus the first error resistance dR1. The third resistor 205 is coupled between the first input end Ni1 and the non-inverting input end of the amplifier 202, wherein the resistance of the third resistor 205 is a difference between a second resistance R2 minus a second error resistance dR2. The fourth resistor 206 is coupled between the second input end Ni2 and the inverting input end of the amplifier 202, wherein the resistance of the fourth resistor is a sum of the second resistance R2 plus the second error resistance dR2.

Figure 3:
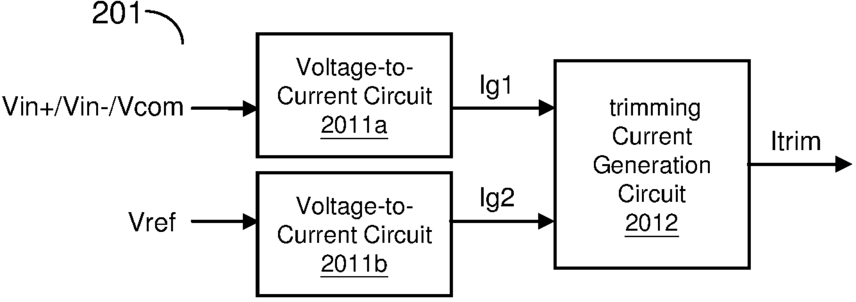
FIG. 3 shows a schematic block diagram of a current source circuit according to an embodiment of the present invention.

Please refer to FIG. 2A along with FIG. 3. The current source circuit 201 is configured to operably generate a trimming current Itrim in a trimming mode according to the first input voltage Vin+ and the reference voltage Vref, according to the second input voltage Vin− and the reference voltage Vref, or according to an input common mode voltage Vcom and the reference voltage Vref, and the current source circuit 201 is configured to operably provide the trimming current Itrim in the normal operation mode, to trim an offset referred to input (RTI) voltage generated due to the first error resistance dR1 and the second error resistance dR2. In one embodiment, the current source circuit 201 is coupled to: a first node Nd1 between the first resistor 203 and the non-inverting input end, a second node Nd2 between the second resistor 204 and the output voltage Vout, a third node Nd3 between the third resistor 205 and the non-inverting input end or a fourth node Nd4 between the fourth resistor 206 and the inverting input end.

As shown in FIG. 2A, in one embodiment, a resistor Rib can optionally be coupled between the non-inverting input end of the amplifier 202 and the current source circuit 201, whereas, a resistor R2*b* can optionally be coupled between the output voltage Vout and the current source circuit 201, whereas, a resistor R3*b* can optionally be coupled between the non-inverting input end of the amplifier 202 and the current source circuit 201, whereas, a resistor R4*b* can optionally be coupled between the inverting input end of the amplifier 202 and the current source circuit 201. In the trimming mode, the first input end Ni1 is electrically connected to the second input end Ni2, so that the first input voltage Vin+ has a same voltage level as the second input voltage Vin−. The reference voltage Vref serves to operably adjust the input common mode voltage Vcom of the amplifier 202, so that the current sensing amplifier circuit 20 has a bidirectional current sensing function.

Figure 6:
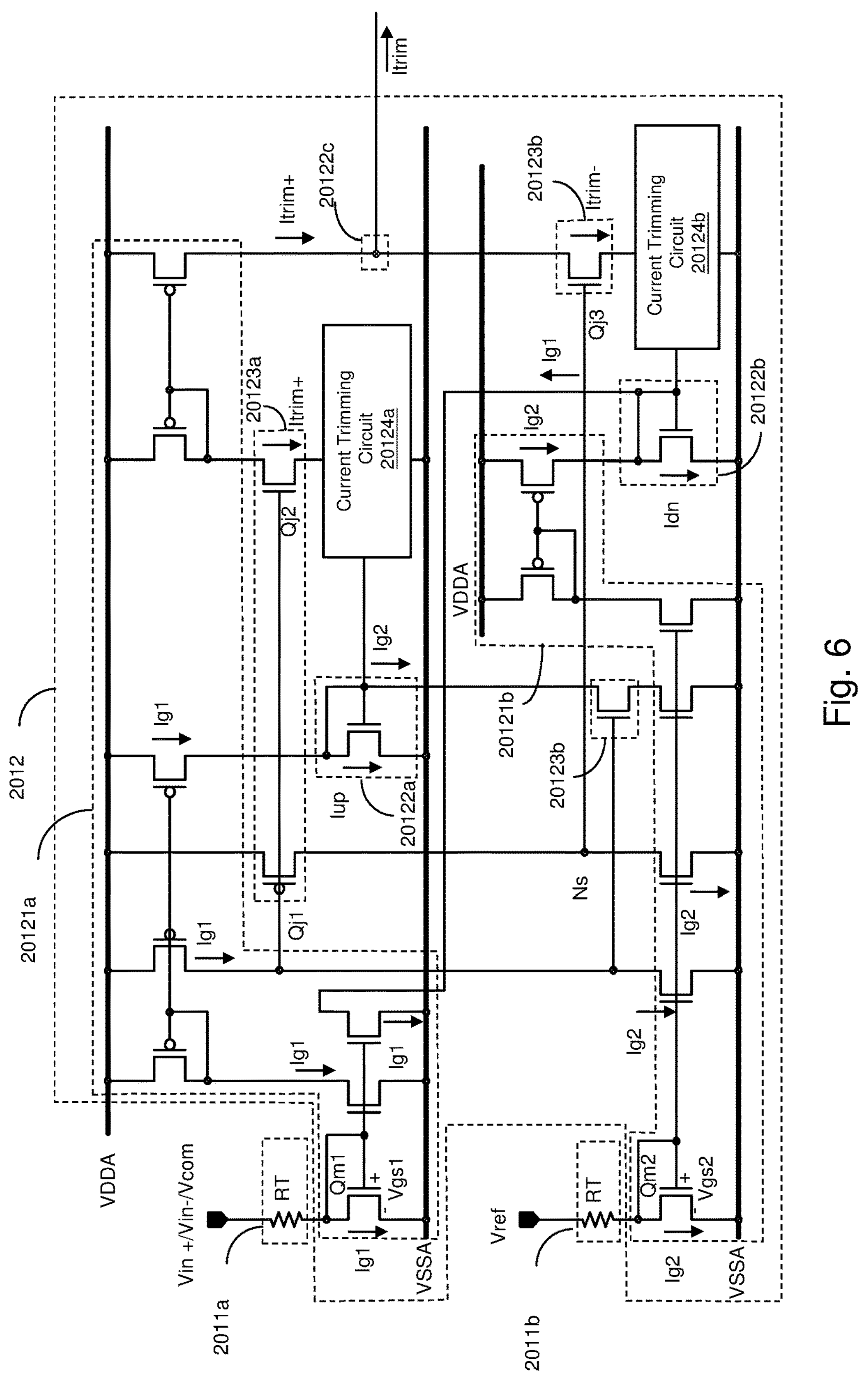
FIG. 6 shows a schematic block diagram of a current source circuit according to another embodiment of the present invention.

Please refer to FIG. 2A along with FIG. 6. For example, in the trimming mode, when the current source circuit 201 is coupled to the second node Nd2 between the second resistor 204 and the output voltage Vout, and the resistor R2*b* is coupled between the output voltage Vout and the current source circuit 201, because the first input voltage Vin+ is equal to the second input voltage Vin−, the output voltage Vout can be represented by the following equation (1):

$$\mathrm{Vout} = \mathrm{V}ref + (\mathrm{Vin}^+ - \mathrm{V}ref)\left(\frac{2R1dR2 + 2R2dR1}{R1R2 + R2^2 + R2dR1 + R1dR2}\right) - (\mathrm{Vin}^+ - \mathrm{V}ref)\cdot m\cdot\left(\frac{R2b}{RT}\right) \quad (1)$$

wherein m denotes a scaling factor of all current mirror circuits and current trimming circuits 20124*a* and 20124*b*;

$$(\mathrm{Vin}^+ - \mathrm{V}ref)\left(\frac{2R1dR2 + 2R2dR1}{R1R2 + R2^2 + R2dR1 + R1dR2}\right)$$

denotes the offset RTI voltage;

$$(\mathrm{Vin}^+ - \mathrm{V}ref)\cdot m\cdot\left(\frac{R2b}{RT}\right)$$

denotes a compensation item of the trimming current Itrim, wherein the compensation item is correlated with the aforementioned offset RTI voltage and the compensation item has no effect on (i.e., is irrelevant to) a gain error of the amplifier 202.

It can be seen from the aforementioned compensation item of the trimming current Itrim that the trimming current Itrim is proportional to for example a difference between the first input voltage Vin+ and the reference voltage Vref. Please refer to FIG. 2A along with FIG. 6 and FIG. 7. In the trimming mode, under a specific condition (i.e., a specific combination of a selected reference voltage Vref and a selected first input voltage Vin+), according to the difference between the output voltage Vout and the reference voltage Vref, the numbers of the conductive transistors in the current trimming circuit 20124*a* and current trimming circuit 20124*b* are successively adjusted (e.g., by adopting any type of approximation approach) to adjust the value of m in the equation (1). The value of m which is obtained in a condition wherein the output voltage Vout is equal to or most approximates to the reference voltage Vref, is an optimum value which can render the offset RTI voltage and the compensation item of the trimming current Itrim to be equal to or most approximate to each other. In the normal operation mode, the numbers of conductive transistors in the current trimming circuit 20124*a* and current trimming circuit 20124*b* can be determined according to the obtained value of m, so that the current source circuit 201 can provide the trimming current to trim the offset RTI voltage generated due to the first error resistance dR1 and the second error resistance dR2 to obtain an optimum result. Besides, because the current trimming circuit 20124*a* and the current trimming circuit 20124*b* operate according to the value of m, regardless how the first input voltage Vin+ and the reference voltage Vref vary, the current source circuit 201 can provide an accurate trimming current Itrim to compensate the offset RTI voltage, and it is not required for the current source circuit 201 to once again enter the trimming mode.

It is worthwhile noting that, the offset RTI voltage trimmed by the present invention refers to the offset RTI voltage of the current sensing amplifier circuit rather than the offset RTI voltage of the amplifier in the current sensing amplifier circuit. The present invention aims at solving the issue of the offset RTI voltage which is generated in manufacturing the resistors in the current sensing amplifier circuit.

In one embodiment, the trimming current Itrim is proportional to a difference between the first input voltage Vin+ and the reference voltage Vref, a difference between the second input voltage Vin− and the reference voltage Vref or a difference between the input common mode voltage Vcom and the reference voltage Vref.

In one embodiment, the first error resistance dR1 is far smaller than the first resistance R1. For example, the first error resistance dR1 is at least smaller than ½ of the first resistance R1. Besides, the second error resistance dR2 is far smaller than the second resistance R2. For example, the second error resistance dR2 is at least smaller than ½ of the second resistance R2. In an ideal current sensing amplifier circuit 20, the first error resistance dR1 and the second error resistance dR2 are both zero. That is, in the ideal current sensing amplifier circuit 20, the first resistor 203 and the second resistor 204 has a same resistance (i.e., first resistance R1), whereas, the third resistor 205 and the fourth resistor 206 has a same resistance (i.e., second resistance R2). Because deviations occur in manufacturing the first resistor 203 and the second resistor 204, practically, the resistance of the first resistor 203 is a sum of the first resistance R1 plus the first error resistance dR1 and the resistance of the second resistor 204 is a difference of the first resistance R1 minus the first error resistance dR1. Also, because deviations occur in manufacturing the third resistor 205 and the fourth resistor 206, the resistance of the third resistor 205 is a difference of the second resistance R2 minus a second error resistance dR2, whereas the resistance of the fourth resistor 206 is a sum of the second resistance R2 plus the second error resistance dR2.

In one embodiment, the current source circuit 201 is configured to operably generate the trimming current Itrim in the trimming mode according to the first input voltage Vin+ and the reference voltage Vref, according to the second input voltage Vin− and the reference voltage Vref, or according to the input common mode voltage Vcom and the reference voltage Vref by a binary approximation approach, a single-slope approximation approach or a successive approximation approach.

It is worthwhile noting that, the input common mode voltage Vcom is an average voltage of the first input voltage Vin+ and the second input voltage Vin−. In a general application, because the voltage level of the first input voltage Vin+, the voltage level of the second input voltage Vin− and the voltage level of the input common mode voltage Vcom are nearly the same among one another, any one of the first input voltage Vin+, the second input voltage Vin− and the input common mode voltage Vcom can be adopted to generate the trimming current Itrim.

Figure 2B:
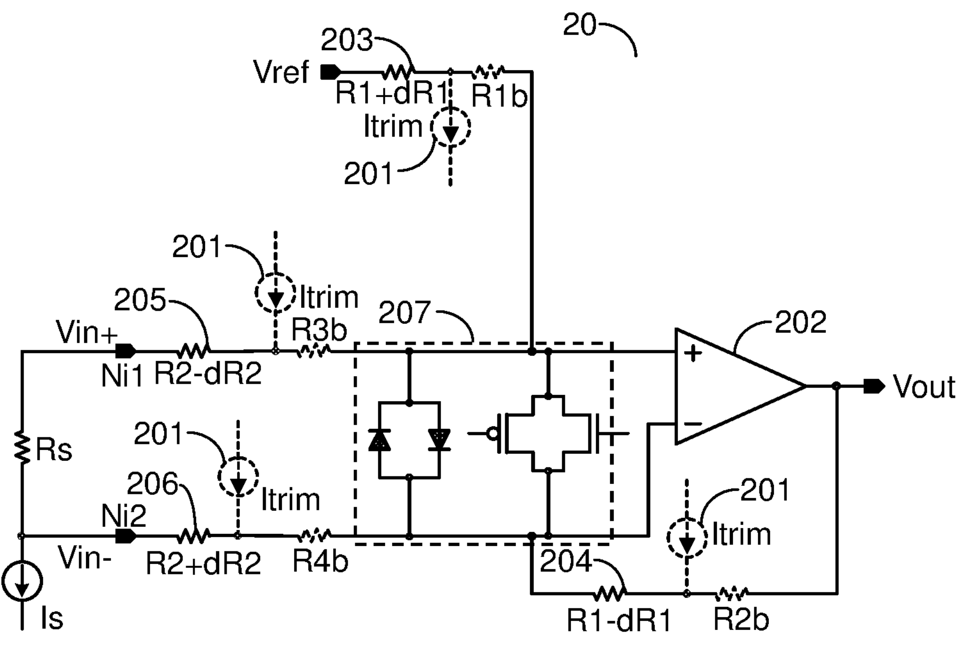
FIG. 2B shows a schematic circuit diagram of a current sensing amplifier circuit according to another embodiment of the present invention.

FIG. 2B shows a schematic circuit diagram of a current sensing amplifier circuit according to another embodiment of the present invention. The current sensing amplifier circuit of this embodiment shown in FIG. 2B is similar to the current sensing amplifier circuit of the embodiment shown in FIG. 2A, but is different in that: the current sensing amplifier circuit of this embodiment in FIG. 2B further includes a chopper circuit 207. The chopper circuit 207 is coupled between the inverting input end and the non-inverting input end of the amplifier 202, wherein the chopper circuit 207 is configured to operably suppress a variation of the offset RTI voltage caused by different input common mode voltages Vcom.

FIG. 3 shows a schematic block diagram of a current source circuit according to an embodiment of the present invention. As shown in FIG. 3, the current source circuit 201 includes: a voltage-to-current conversion circuit 2011*a*, a voltage-to-current conversion circuit 2011*b* and a trimming current generation circuit 2012. The voltage-to-current conversion circuit 2011*a* is configured to operably convert the first input voltage Vin+, the second input voltage Vin− or the input common mode voltage Vcom, to a first current Ig1. The voltage-to-current conversion circuit 2011*b* is configured to operably convert the reference voltage Vref to a second current Ig2. The trimming current generation circuit 2012 is configured to operably generate the trimming current Itrim according to the first current Ig1 and the second current Ig2 in the trimming mode, so that the output voltage Vout is equal to or most approximates to the reference voltage Vref.

Figure 4:
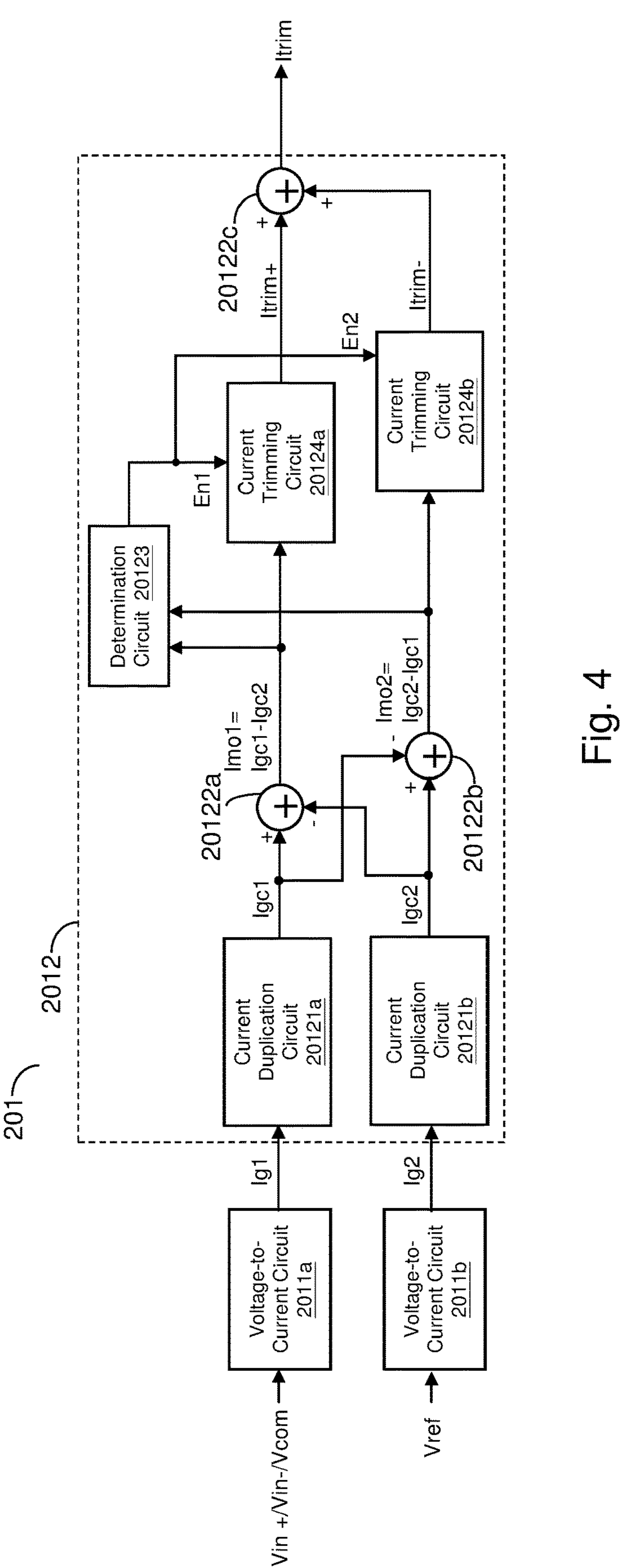
FIG. 4 shows a schematic block diagram of a current source circuit and a schematic block diagram of a trimming current generation circuit in a current source circuit according to an embodiment of the present invention.

FIG. 4 shows a schematic block diagram of a current source circuit and a schematic block diagram of a trimming current generation circuit in a current source circuit according to an embodiment of the present invention. The voltage-to-current conversion circuit 2011*a* and the voltage-to-current conversion circuit 2011*b* of this embodiment shown in FIG. 4 are similar to the voltage-to-current conversion circuit 2011*a* and the voltage-to-current conversion circuit 2011*b* of the embodiment shown in FIG. 3, so the details thereof are not redundantly repeated here. As shown in FIG. 4, the trimming current generation circuit includes: a current duplication circuit 20121*a*, a current duplication circuit 20121*b*, a summation circuit 20122*a*, a summation circuit 20122*b*, a summation circuit 20122*c*, a determination circuit 20123, a current trimming circuit 20124*a* and a current trimming circuit 20124*b*. The current duplication circuit 20121*a* is configured to operably duplicate the first current Ig1, to generate a first duplication current Igc1, whereas, the current duplication circuit 20121*b* is configured to operably duplicate the second current Ig2, to generate a second duplication current Igc2. The summation circuit 20122*a* is configured to operably subtract the first duplication current Igc1 by the second duplication current Igc2, to generate a first subtraction result Imo1. The summation circuit 20122*b* is configured to operably subtract the second duplication current Igc2 by the first duplication current Igc1, to generate a second subtraction result Imo2.

The determination circuit 20123 is configured to operably generate a first enable signal En1 when the first duplication current Igc1 is higher than the second duplication current Igc2 and generate a second enable signal En2 when the second duplication current Igc2 is higher than the first duplication current Igc1. When the current trimming circuit 20124*a* is enabled by the first enable signal En1, the current trimming circuit 20124*a* trims the first subtraction result Imo1, to generate a first trimming current Itrim+. When the current trimming circuit 20124*b* is enabled by the second enable signal En2, the current trimming circuit 20124*b* trims the second subtraction result Imo2, to generate a second trimming current Itrim−. The summation circuit 20122*c* is configured to operably add the first trimming current Itrim+ with the second trimming current Itrim−, to generate the trimming current Itrim. In one embodiment, each of the first current duplication circuit 20121*a* and the second current duplication circuit 20121*b* includes at least one current mirror circuit. The determination circuit 20123 can be implemented by various ways which are well known to those skilled in the art, so the details thereof are not redundantly explained here.

Figure 5:
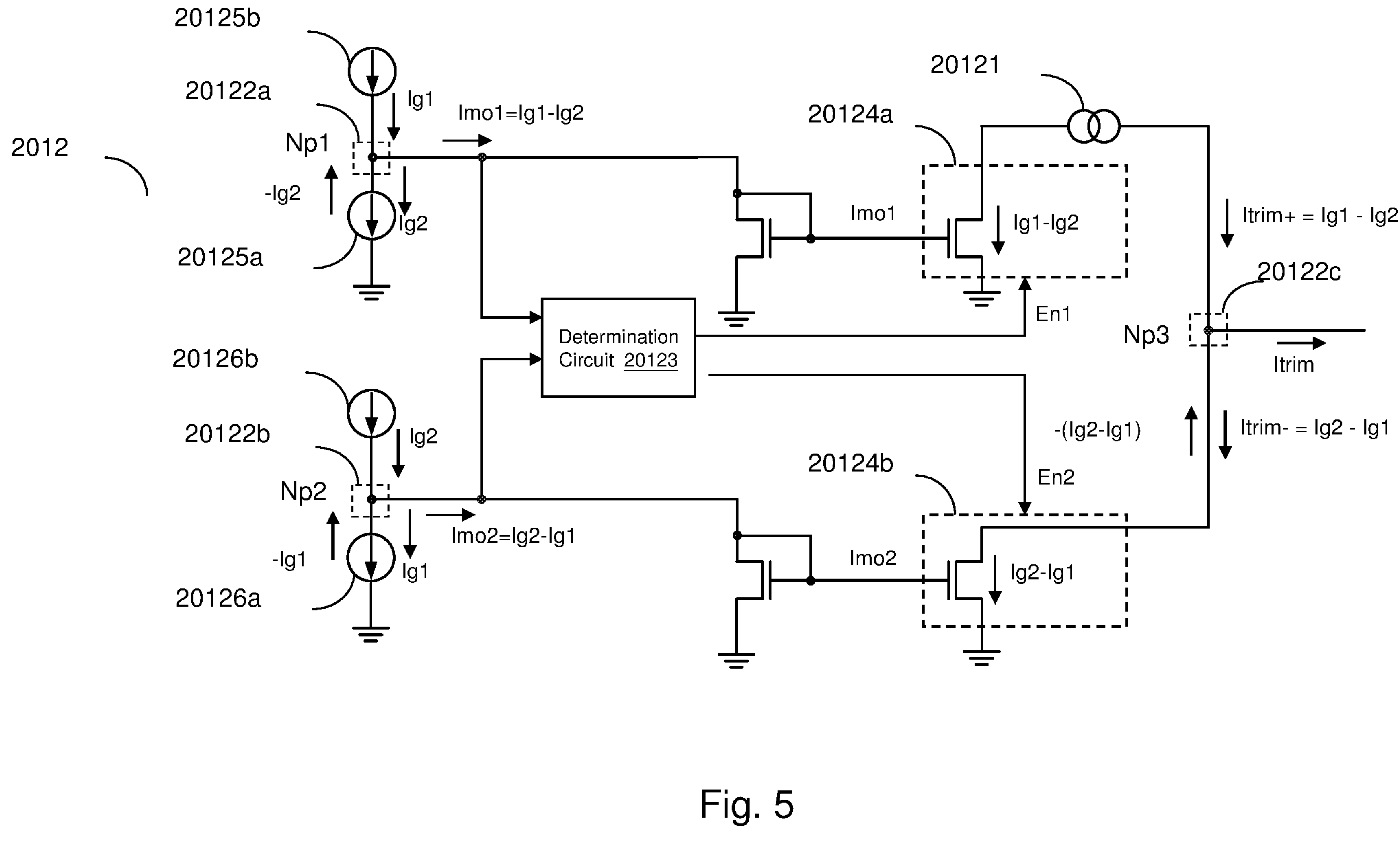
FIG. 5 shows a schematic block diagram of a trimming current generation circuit in a current source circuit according to another embodiment of the present invention.

FIG. 5 shows a schematic block diagram of a trimming current generation circuit in a current source circuit according to another embodiment of the present invention. The determination circuit 20123 of this embodiment shown in FIG. 5 is similar to the determination circuit 20123 of the embodiment shown in FIG. 4, so the details thereof are not redundantly repeated here. As shown in FIG. 5, in this embodiment, the summation circuit 20122*a*, the summation circuit 20122*b* and the summation circuit 20122*c* are implemented as direct coupling at a node Np1, a node Np2 and a node Np3, respectively. A current source 20125*a* is coupled between one end of the summation circuit 20122*a* and ground potential, to provide the second current Ig2 flowing from the node Np1 to the ground potential, or in fact, the second current Ig2 actually corresponds to a negative second current −Ig2 flowing from the ground potential to the node Np1. A current source 20125*b* is coupled to another end of the summation circuit 20122*a*, to provide the first current Ig1 flowing to the node Np1. As a result, by the summation operation of the summation circuit 20122*a* to add the first current Ig1 with the negative second current −Ig2, the first subtraction result Imo1 is generated. A current source 20126*a* is coupled between one end of the summation circuit 20122*b* and ground potential, to provide the first current Ig1 flowing from the node Np2 to the ground potential, or in fact, the first current Ig1 actually corresponds to a negative first current −Ig1 flowing from the ground potential to the node Np2. A current source 20126*b* is coupled to another end of the summation circuit 20122*b*, to provide the second current Ig2 flowing to the node Np2. As a result, by the summation operation of the summation circuit 20122*b* to add the second current Ig2 with the negative first current −Ig1, the second subtraction result Imo2 is generated.

A current duplication circuit 20121 of this embodiment is implemented as a current mirror. Each of the current trimming circuit 20124*a* and the current trimming circuit 20124*b* of this embodiment is implemented as a transistor switch having a trimming scaling factor which is equal to 1:1. As a consequence, in this case, the first trimming current Itrim+ is equal to a difference of the first current Ig1 minus the second current Ig2 and the second trimming current Itrim− is equal to a difference of the second current Ig2 minus the first current Ig1, wherein the second trimming current Itrim− flows out from the node Np3, which actually corresponds to a negative second trimming current (i.e., whose value is equal to a negative value of the second current Ig2 minus the first current Ig1; that is: −(Ig2−Ig1)) flowing to the node Np3. By the summation operation of the summation circuit 20122*c*, the trimming current Itrim is generated. It is worthwhile mentioning that, in different embodiments of the present invention, or both of the current trimming circuit 20124*a* and the current trimming circuit 20124*b* can be implemented as a combination of plural switches having trimming scaling factors of any other values.

FIG. 6 shows a schematic block diagram of a current source circuit according to another embodiment of the present invention. As shown in FIG. 6, in this embodiment, the voltage-to-current conversion circuit 2011*a* includes a resistor RT, whereas the voltage-to-current conversion circuit 2011*b* also includes a resistor RT. Each of the first current duplication circuit 20121*a* and the second current duplication circuit 20121*b* includes at least one current mirror circuit. In this embodiment, each of the summation circuit 20122*a* and the summation circuit 20122*b* is implemented as a transistor, whereas, the summation circuit 20122*c* is implemented as direct coupling. In this embodiment, a determination circuit 20123*a* includes at least one switch Qj1 and Qj2, whereas, a determination circuit 20123*b* includes a switch Qj3. As shown in FIG. 6, the first current Ig1 can be represented by the following equation (2):

$$Ig1 = \frac{(\mathrm{Vin}^{+} - \mathrm{V}gs1)}{RT} \tag{2}$$

wherein RT denotes a resistance of the resistor RT, and Vgs1 denotes a gate-source voltage of a transistor Qm1. Likewise, the second current Ig2 can be represented by the following equation (3):

$$Ig2 = \frac{(\mathrm{V}ref - \mathrm{V}gs2)}{RT} \tag{3}$$

wherein Vgs2 denotes a gate-source voltage of a transistor Qm2. As shown in FIG. 6, the summation circuit 20122*a* is configured to operably subtract the first current Ig1 by the second current Ig2, to generate a current Iup. Assuming that the gate-source voltage of the transistor Qm1 is equal to the gate-source voltage of the transistor Qm2, in this case, the current Iup can be represented by the following equation (4):

$$Iup = \frac{(\mathrm{Vin}^{+} - \mathrm{V}ref)}{RT} \tag{4}$$

The current Iup is trimmed by the current trimming circuit 20124*a*, to obtain the first trimming current Itrim+. As shown in FIG. 6, the summation circuit 20122*b* is configured to subtract the second current Ig2 by the first current Ig1, to generate a current Idn. Assuming that the gate-source voltage of the transistor Qm1 is equal to the gate-source voltage of the transistor Qm2, in this case, the current Idn can be represented by the following equation (5):

$$Idn = \frac{(\mathrm{V}ref - \mathrm{Vin}^{+})}{RT} \tag{5}$$

The current Idn is trimmed by the current trimming circuit 20124*b*, to obtain the second trimming current Itrim−. Being the same as the embodiment shown in FIG. 5, the summation circuit 20122*c* is configured to add the first trimming current Itrim+ with the second trimming current Itrim−, to generate the trimming current Itrim. It is worthwhile mentioning that, one or both of the current trimming circuit 20124*a* and the current trimming circuit 20124*b* can be implemented as a switch or a combination of plural switches to produce a trimming scaling factor which is equal to 1:1 or equal to any other value. In this embodiment, let it be assumed that the trimming scaling factor is equal to m and let it be assumed that the scaling factor of every current mirror is equal to 1; in this case, the first trimming current Itrim+ and the second trimming current Itrim− can be represented by the following equation (6) and the following equation (7), respectively:

$$Itrim^{+} = \frac{(\mathrm{Vin}^{+} - \mathrm{V}ref)}{RT} \times m \tag{6}$$

$$Itrim^{-} = \frac{(\mathrm{V}ref - \mathrm{Vin}^{+})}{RT} \times m \tag{7}$$

In one embodiment, when a difference of the first current Ig1 minus the second current Ig2 is greater than zero, the gate signal of the switch Qj1 is switched to disable level, whereas, the gate signal of the switch Qj2 is switched to enable level, so that the switch Qj2 is ON, thereby generating the first trimming current Itrim+. Because the gate signal of the switch Qj1 is switched to disable level, the switch Qj1 is OFF, whereby the node Ns is coupled to ground potential, and the gate signal of the switch Qj3 is switched to disable level and to turn OFFF the switch Qj3. Consequently, it is ensured that when the first trimming current Itrim+ is a positive value, the second trimming current Itrim− is zero.

Figure 7:
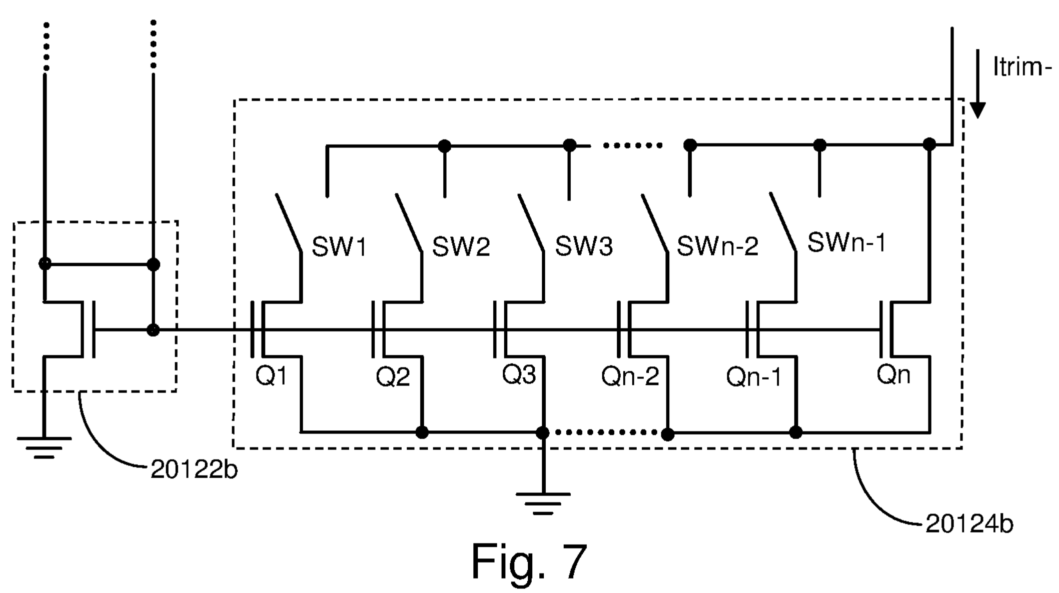
FIG. 7 shows a schematic block diagram of a current trimming circuit according to an embodiment of the present invention.

FIG. 7 shows a schematic block diagram of a current trimming circuit according to an embodiment of the present invention. The current trimming circuit 20124*b* of this embodiment is an exemplary embodiment of the current trimming circuit 20124*b* of FIG. 4 and the current trimming circuit 20124*b* of FIG. 6. The current trimming circuit 20124*a* of FIG. 4 and the current trimming circuit 20124*a* of FIG. 6 also can be implemented as the current trimming circuit 20124*b* of this embodiment shown in FIG. 7. As shown FIG. 7, the current trimming circuit 20124*b* includes: one switch Q1 or plural switches Q1~Qn having gates coupled to one another. The current trimming circuit 20124*b* is configured to adjust a number of conductive switches in the switches SW1~SWn-1 according to a preset trimming scaling factor, so as to determine the trimming current Itrim in the trimming mode, so that the output voltage Vout is equal to or most approximates to the reference voltage Vref. The number of conductive switches in the switches SW1~SWn-1 can be determined for example by adopting a binary approximation approach, a single-slope approximation approach or a successive approximation approach, so as to determine the optimum trimming current Itrim to make the output voltage Vout to be equal to or most approximate to the reference voltage Vref. The binary approximation approach, the single-slope approximation approach and the successive approximation approach are well known to those skilled in the art, so the details thereof are not redundantly explained here.

Figure 8:
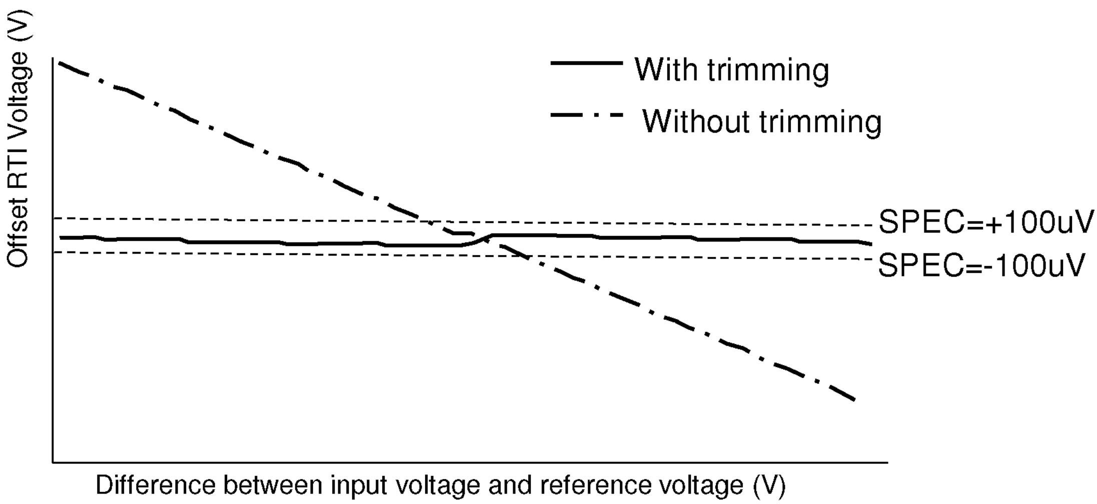
FIG. 8 is a diagram showing the relationship of a difference between the input voltage and the reference voltage versus an offset RTI voltage of a current sensing amplifier circuit with trimming according to an embodiment of the present invention, and of the same without trimming.

FIG. 8 is a diagram showing the relationship of a difference between the input voltage and the reference voltage versus an offset RTI voltage of a current sensing amplifier circuit with trimming according to an embodiment of the present invention, and of the same without trimming. FIG. 8 demonstrates that, as compared to being without trimming, the offset RTI voltage can be remarkably mitigated by the simple trimming procedure provided by the present invention.

Figure 9:
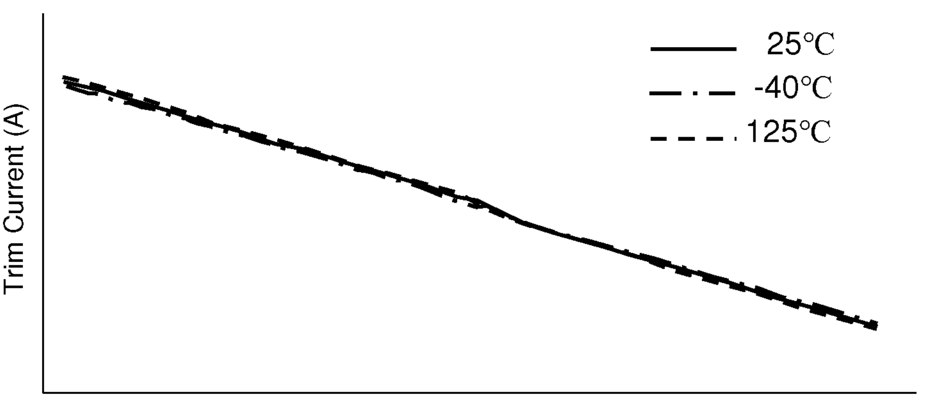
FIG. 9 is a diagram showing the relationship of a difference between the input voltage and the reference voltage versus a trimming current under different temperatures according to an embodiment of the present invention.
Figure 10:
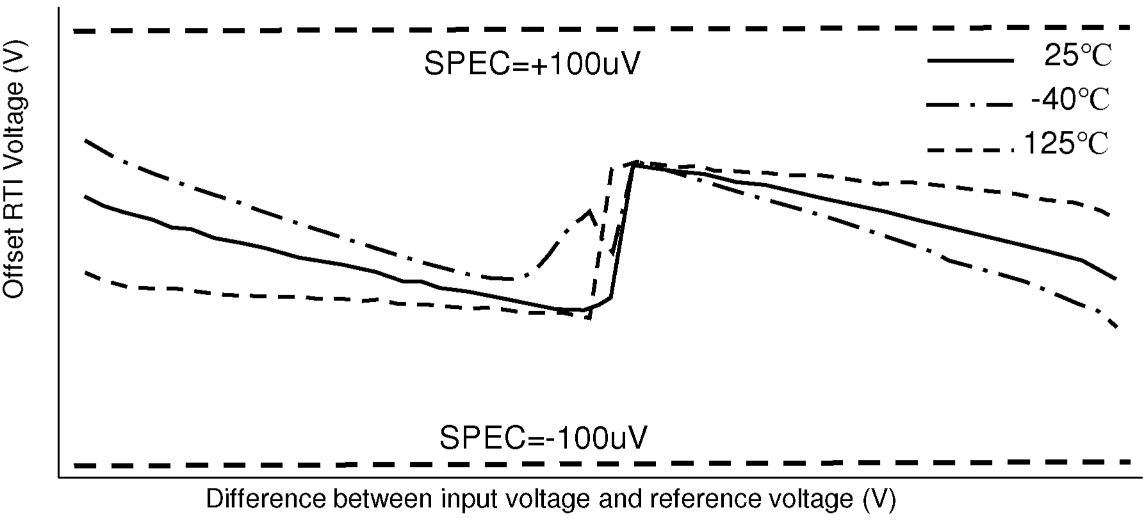
FIG. 10 is a diagram showing the relationship of a difference between the input voltage and the reference voltage versus an offset RTI voltage under different temperatures according to an embodiment of the present invention.

FIG. 9 is a diagram showing the relationship of a difference between the input voltage and the reference voltage versus a trimming current under different temperatures according to an embodiment of the present invention. FIG. 10 is a diagram showing the relationship of a difference between the input voltage and the reference voltage versus an offset RTI voltage under different temperatures according to an embodiment of the present invention. FIG. 9 and FIG. 10 demonstrate that, the trimming current Itrim generated under different temperatures remains capable of stably trimming the offset RTI voltage.

Figure 11:
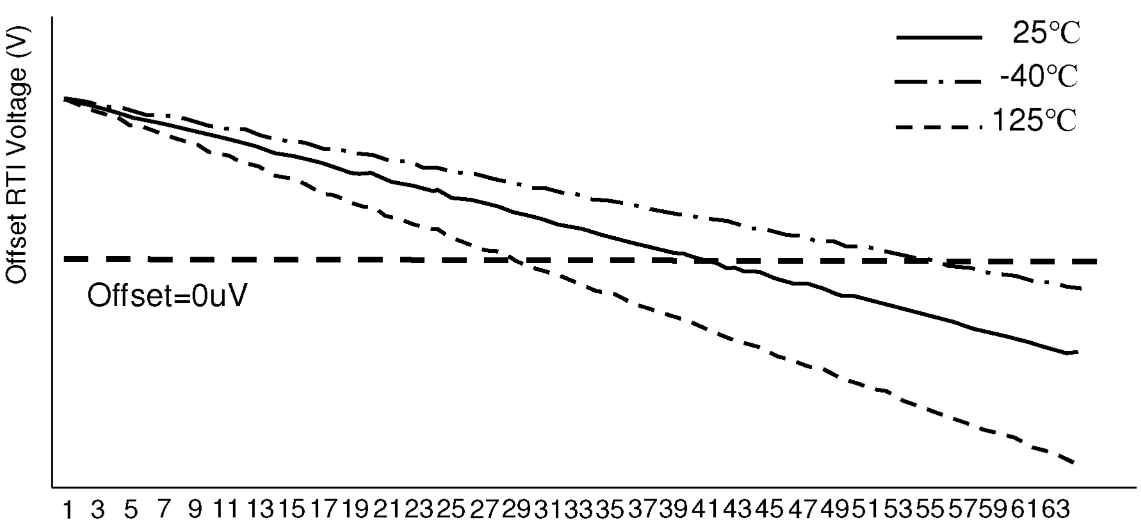
FIG. 11 is a diagram showing the relationship of trimming codes adopted by a current trimming circuit versus offset RTI voltages when a current sensing amplifier circuit is under different temperatures according to an embodiment of the present invention.
Figure 12:
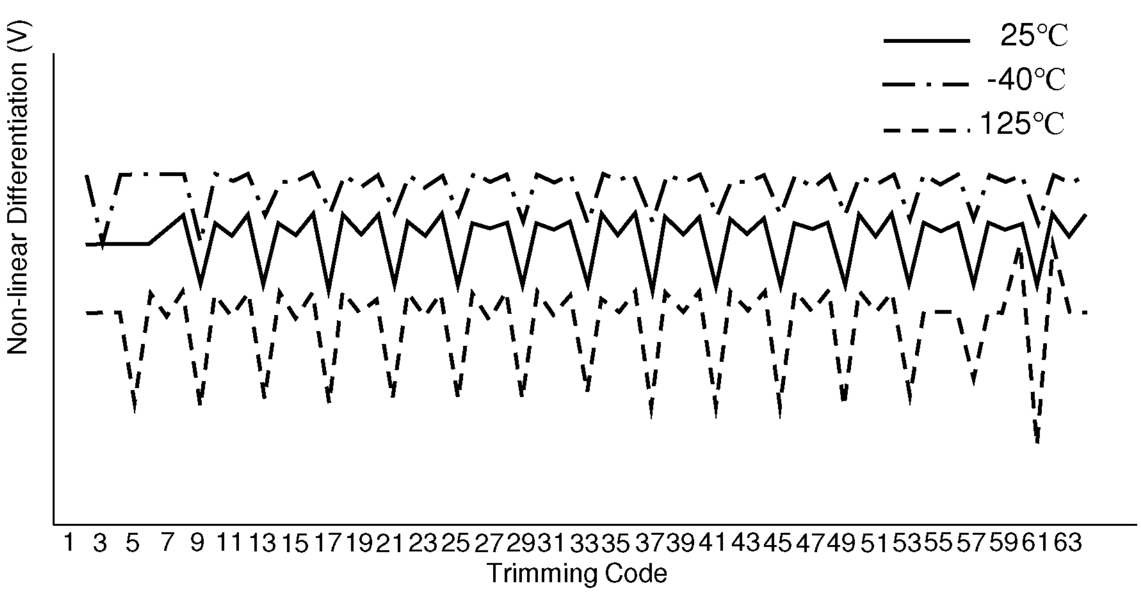
FIG. 12 is a diagram showing the relationship of trimming codes adopted by a current trimming circuit versus non-linear differentiation when a current sensing amplifier circuit is under different temperatures according to an embodiment of the present invention.
Figure 13:
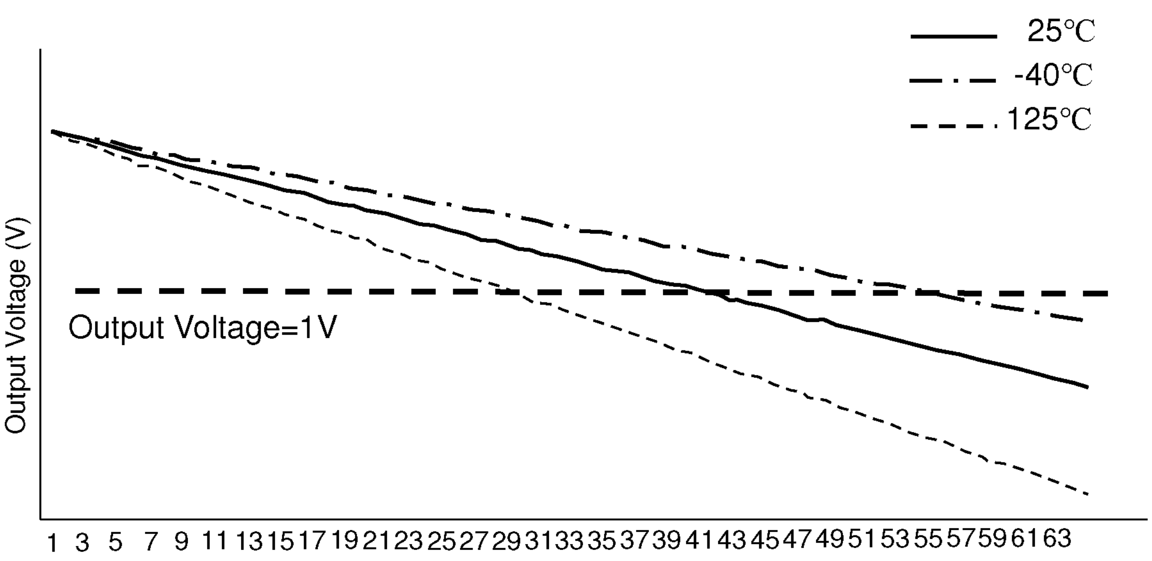
FIG. 13 is a diagram showing the relationship of trimming codes adopted by a current trimming circuit versus output voltages when a current sensing amplifier circuit is under different temperatures according to an embodiment of the present invention.

FIG. 11 is a diagram showing the relationship of trimming codes adopted by a current trimming circuit versus offset RTI voltages when a current sensing amplifier circuit is under different temperatures according to an embodiment of the present invention. FIG. 12 is a diagram showing the relationship of trimming codes adopted by a current trimming circuit versus non-linear differentiation when a current sensing amplifier circuit is under different temperatures according to an embodiment of the present invention. FIG. 13 is a diagram showing the relationship of trimming codes adopted by a current trimming circuit versus output voltages when a current sensing amplifier circuit is under different temperatures according to an embodiment of the present invention. FIG. 11 to FIG. 13 demonstrate compensation results of different trimming currents (which are represented by different trimming codes, wherein the different trimming codes indicate different trimming scaling factors), under the condition that the first input voltage Vin+ is equal to 26V and the reference voltage Vref is equal to 1V.

Figure 14:
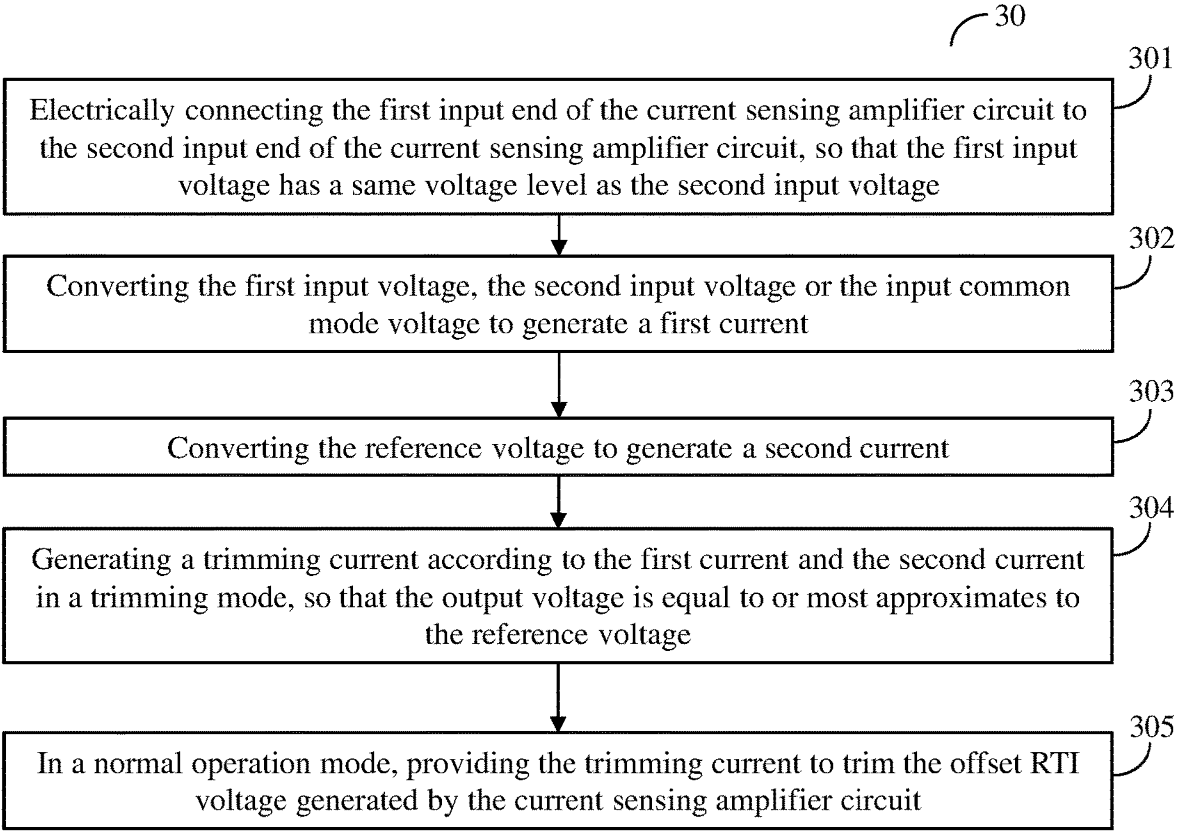
FIG. 14 shows a flow chart diagram of operation steps of an offset RTI voltage trimming method of according to an embodiment of the present invention.
Figures 15, 16:
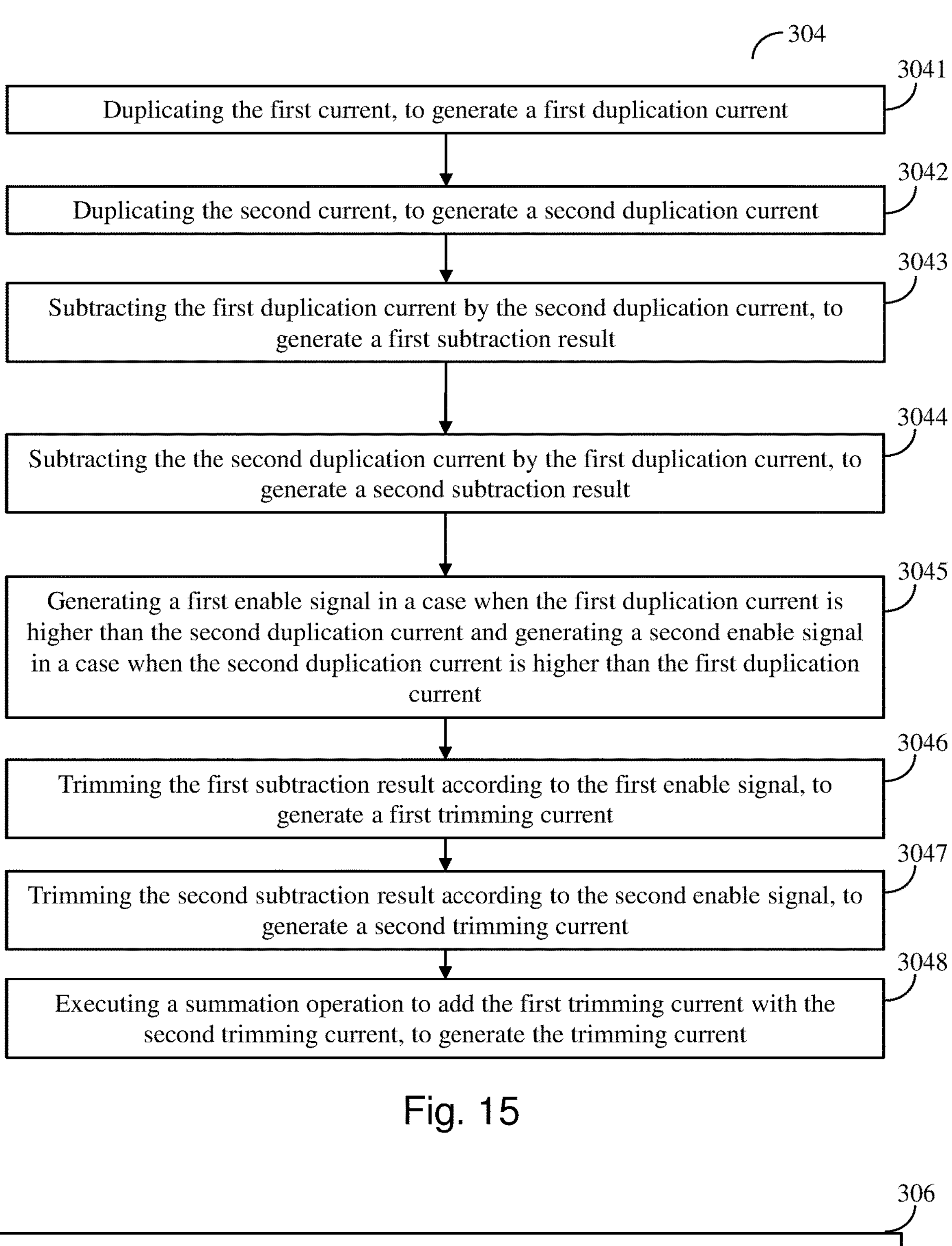
FIG. 15 shows a flow chart diagram of operation steps for generating a trimming current according to an embodiment of the present invention.
FIG. 16 shows a flow chart diagram of operation steps of a chopper circuit according to an embodiment of the present invention in suppressing variation of the offset RTI voltage caused by different input common mode voltages.

FIG. 14 shows a flow chart diagram of operation steps of an offset RTI voltage trimming method of according to an embodiment of the present invention. FIG. 15 shows a flow chart diagram of operation steps for generating a trimming current according to an embodiment of the present invention. FIG. 16 shows a flow chart diagram of operation steps of a chopper circuit according to an embodiment of the present invention in suppressing variation of the offset RTI voltage caused by different input common mode voltages. As shown in FIG. 14, the offset RTI voltage trimming method of the present invention comprises following steps: first, step 301 is executed: electrically connecting the first input end of the current sensing amplifier circuit to the second input end of the current sensing amplifier circuit, so that the first input voltage has a same voltage level as the second input voltage. Next, step 302 is executed: converting the first input voltage, the second input voltage or the input common mode voltage to generate a first current. Next, step 303 is executed: converting the reference voltage to generate a second current. Next, step 303 is executed: generating a trimming current according to the first current and the second current in a trimming mode, so that the output voltage is equal to or most approximates to the reference voltage. Next, step 305 is executed: in a normal operation mode, providing the trimming current, to trim the offset RTI voltage generated by the current sensing amplifier circuit.

As shown in FIG. 15, in one embodiment, the step 304 includes step 3041 to step 3048. First, step 3041 is executed: duplicating the first current, to generate a first duplication current. Next, step 3042 is executed: duplicating the second current, to generate a second duplication current. Next, step 3043 is executed: subtracting the first duplication current by the second duplication current, to generate a first subtraction result. Next, step 3044 is executed: subtracting the second duplication current by the first duplication current, to generate a second subtraction result. Next, step 3045 is executed: generating a first enable signal in a case when the first duplication current is higher than the second duplication current and generating a second enable signal in a case when the second duplication current is higher than the first duplication current. Next, step 3046 is executed: trimming the first subtraction result according to the first enable signal, to generate a first trimming current. Next, step 3047 is executed: trimming the second subtraction result according to the second enable signal, to generate a second trimming current. Next, step 3048 is executed: executing a summation operation to add the first trimming current with the second trimming current, to generate the trimming current. In one embodiment, referring to FIG. 16, the method can further include step 306, which includes: coupling a chopper circuit between the inverting input end and the non-inverting input end, wherein the chopper circuit is configured to operably suppress a variation of the offset RTI voltage caused by different input common mode voltages.

As described above, the present invention provides a current sensing amplifier circuit and an offset RTI voltage trimming method thereof. that the current sensing amplifier circuit of the present invention can achieve bidirectional current sensing function; and that the present invention can cope with the manufacture deviations in resistors and improve the accuracy of the gain by a trimming current.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A current sensing amplifier circuit, which is configured to operably sense a to-be-sensed current flowing through a sensing resistor, wherein the sensing resistor has two ends correspondingly coupled to a first input end and a second input end of the current sensing amplifier circuit; the current sensing amplifier circuit comprising:

an amplifier, which is configured to operably generate an output voltage correlated with the to-be-sensed current according to a first input voltage at the first input end and a second input voltage at the second input end in a normal operation mode;

a first resistor coupled between a reference voltage and a non-inverting input end of the amplifier, wherein a resistance of the first resistor is a sum of a first resistance plus a first error resistance;

a second resistor coupled between the output voltage and an inverting input end of the amplifier, wherein a resistance of the second resistor is a difference of the first resistance minus the first error resistance;

a third resistor coupled between the first input end and the non-inverting input end of the amplifier, wherein a resistance of the third resistor is a difference of a second resistance minus a second error resistance;

a fourth resistor coupled between the second input end and the inverting input end of the amplifier, wherein a resistance of the fourth resistor is a sum of the second resistance plus the second error resistance; and a current source circuit, which is configured to operably generate a trimming current in a trimming mode according to the first input voltage and the reference voltage, according to the second input voltage and the reference voltage, or according to an input common mode voltage and the reference voltage, and the current source circuit is configured to operably provide the trimming current to trim an offset referred to input (RTI) voltage generated due to the first error resistance and the second error resistance in the normal operation mode;

wherein the current source circuit is coupled to: a first node between the first resistor and the non-inverting input end, a second node between the second resistor and the output voltage, a third node between the third resistor and the non-inverting input end, or a fourth node between the fourth resistor and the inverting input end;

wherein in the trimming mode, the first input end is electrically connected to the second input end, so that the first input voltage has a same voltage level as the second input voltage.

2. The current sensing amplifier circuit of claim 1, wherein the current source circuit includes:

a first voltage-to-current conversion circuit, which is configured to operably convert the first input voltage, the second input voltage or the input common mode voltage to generate a first current;

a second voltage-to-current conversion circuit, which is configured to operably convert the reference voltage to generate a second current; and a trimming current generation circuit, which is configured to operably generate the trimming current according to the first current and the second current in the trimming mode, so that the output voltage is equal to or most approximates to the reference voltage.

3. The current sensing amplifier circuit of claim 2, wherein the trimming current generation circuit includes:

a first current duplication circuit, which is configured to operably duplicate the first current, to generate a first duplication current;

a second current duplication circuit, which is configured to operably duplicate the second current, to generate a second duplication current;

a first summation circuit, which is configured to operably subtract the first duplication current by the second duplication current, to generate a first subtraction result;

a second summation circuit, which is configured to operably subtract the second duplication current by the first duplication current, to generate a second subtraction result;

a determination circuit, which is configured to operably generate a first enable signal when the first duplication current is higher than the second duplication current and generate a second enable signal when the second duplication current is higher than the first duplication current;

a first current trimming circuit, which is configured to, when enabled by the first enable signal, trim the first subtraction result to generate a first trimming current;

a second current trimming circuit, which is configured to, when enabled by the second enable signal, trim the second subtraction result to generate a second trimming current; and a third summation circuit, which is configured to operably execute a summation operation to add the first trimming current with the second trimming current, so as to generate the trimming current.

4. The current sensing amplifier circuit of claim 3, wherein each of the first current duplication circuit and the second current duplication circuit includes at least one current mirror circuit.

5. The current sensing amplifier circuit of claim 1, wherein the reference voltage is configured to operably adjust the input common mode voltage, so that the current sensing amplifier circuit has a bidirectional current sensing function.

6. The current sensing amplifier circuit of claim 1, further comprising:

a chopper circuit coupled between the inverting input end and the non-inverting input end, wherein the chopper circuit is configured to operably suppress a variation of the offset RTI voltage caused by different input common mode voltages.

7. The current sensing amplifier circuit of claim 1, wherein the offset RTI voltage is correlated with a compensation item of the trimming current, and wherein the compensation item is irrelevant to a gain error of the amplifier.

8. The current sensing amplifier circuit of claim 1, wherein the trimming current is proportional to a difference between the first input voltage and the reference voltage, a difference between the second input voltage and the reference voltage, or a difference between the input common mode voltage and the reference voltage.

9. The current sensing amplifier circuit of claim 1, wherein the first error resistance is smaller than ½ of the first resistance and the second error resistance is smaller than ½ of the second resistance.

10. The current sensing amplifier circuit of claim 1, wherein the current source circuit is configured to operably generate the trimming current in the trimming mode according to the first input voltage and the reference voltage by a binary approximation approach, a single-slope approximation approach or a successive approximation approach.

11. An offset referred to input (RTI) voltage trimming method, which is configured to operably trim an offset RTI voltage of a current sensing amplifier circuit; the offset RTI voltage trimming method comprising steps of:

electrically connecting a first input end of the current sensing amplifier circuit to a second input end of the current sensing amplifier circuit, so that a first input voltage at the first input end has a same voltage level as a second input voltage at the second input end;

converting the first input voltage, the second input voltage or an input common mode voltage to generate a first current;

converting a reference voltage to generate a second current; and generating a trimming current according to the first current and the second current in a trimming mode, so that an output voltage is equal to or most approximates to the reference voltage;

wherein a first resistor of the current sensing amplifier circuit is coupled between a reference voltage and a non-inverting input end of an amplifier of the current sensing amplifier circuit; and wherein in a normal operation mode, the trimming current is provided to trim the offset RTI voltage generated by the current sensing amplifier circuit.

12. The offset RTI voltage trimming method of claim 11, wherein the step for generating the trimming current according to the first current and the second current in the trimming mode, so that the output voltage is equal to or most approximates to the reference voltage includes:

duplicating the first current, to generate a first duplication current;

duplicating the second current, to generate a second duplication current;

subtracting the first duplication current by the second duplication current, to generate a first subtraction result;

subtracting the second duplication current by the first duplication current, to generate a second subtraction result;

generating a first enable signal when the first duplication current is higher than the second duplication current and generating a second enable signal when the second duplication current is higher than the first duplication current;

trimming the first subtraction result according to the first enable signal, to generate a first trimming current;

trimming the second subtraction result according to the second enable signal, to generate a second trimming current; and executing a summation operation to add the first trimming current with the second trimming current, to generate the trimming current.

13. The offset RTI voltage trimming method of claim 11, wherein the reference voltage is configured to operably adjust the input common mode voltage, so that the current sensing amplifier circuit has a bidirectional current sensing function.

14. The offset RTI voltage trimming method of claim 11, further comprising:

coupling a chopper circuit between an inverting input end of the amplifier of the current sensing amplifier circuit and the non-inverting input end, wherein the chopper circuit is configured to operably suppress a variation of the offset RTI voltage caused by different input common mode voltages.

15. The offset RTI voltage trimming method of claim 11, wherein the offset RTI voltage is correlated with a compensation item of the trimming current, and wherein the compensation item is irrelevant to a gain error of the amplifier.

16. The offset RTI voltage trimming method of claim 11, wherein a resistance of the first resistor is a sum of a first resistance plus a first error resistance; wherein a second resistor of the current sensing amplifier circuit is coupled between the output voltage and an inverting input end of the amplifier, wherein a resistance of the second resistor is a difference of the first resistance minus the first error resistance; wherein a third resistor of the current sensing amplifier circuit is coupled between the first input end and the non-inverting input end of the amplifier, wherein a resistance of the third resistor is a difference of a second resistance minus a second error resistance; wherein a fourth resistor of the current sensing amplifier circuit is coupled between the second input end and the inverting input end of the amplifier, wherein a resistance of the fourth resistor is a sum of the second resistance plus the second error resistance; wherein the offset RTI voltage is correlated with the first error resistance and the second error resistance.

17. The offset RTI voltage trimming method of claim 11, wherein the trimming current is proportional to a difference between the first input voltage and the reference voltage, a difference between the second input voltage and the reference voltage, or a difference between the input common mode voltage and the reference voltage.

18. The offset RTI voltage trimming method of claim 16, wherein the first error resistance is smaller than ½ of the first resistance and the second error resistance is smaller than ½ of the second resistance.

19. The offset RTI voltage trimming method of claim 11, wherein the step for generating the trimming current according to the first current and the second current in the trimming mode, so that the output voltage is equal to or most approximates to the reference voltage includes:

generating the trimming current by a binary approximation approach, a single-slope approximation approach or a successive approximation approach.

* * * * *